(12) United States Patent
Singh et al.

(10) Patent No.: US 8,900,987 B1
(45) Date of Patent: Dec. 2, 2014

(54) METHOD FOR REMOVING BUMPS FROM INCOMPLETE AND DEFECTIVE INTERPOSER DIES FOR STACKED SILICON INTERCONNECT TECHNOLOGY (SSIT) DEVICES

(71) Applicant: Xilinx, Inc., San Jose, CA (US)

(72) Inventors: Inderjit Singh, Saratoga, CA (US); Raghunandan Chaware, Mountain View, CA (US); Ganesh Hariharan, Santa Clara, CA (US); Glenn O'Rourke, Gilroy, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/046,846

(22) Filed: Oct. 4, 2013

(51) Int. Cl.
*H01L 21/44* (2006.01)
*H01L 23/00* (2006.01)

(52) U.S. Cl.
CPC ..................................... *H01L 24/11* (2013.01)

USPC .......................................................... 438/613

(58) Field of Classification Search
None
See application file for complete search history.

(56) References Cited

U.S. PATENT DOCUMENTS

| | | | |
|---|---|---|---|
| 2003/0073300 A1* | 4/2003 | Chen et al. ................. | 438/613 |
| 2013/0171816 A1* | 7/2013 | Jin ............................. | 438/613 |
| 2013/0207259 A1* | 8/2013 | Yutani et al. ............... | 257/737 |

* cited by examiner

*Primary Examiner* — Benjamin Sandvik
(74) *Attorney, Agent, or Firm* — Gerald Chan

(57) ABSTRACT

A method for removing bumps from incomplete interposer die(s) and/or defective interposer die(s) of an interposer wafer is described. The method includes forming bumps on an interposer wafer; identifying at least one incomplete interposer die and/or at least one defective interposer die of the interposer wafer; and removing bumps from the at least one incomplete interposer die and/or the at least one defective interposer die of the interposer wafer.

19 Claims, 22 Drawing Sheets

METHOD FOR REMOVING BUMPS FROM INCOMPLETE AND DEFECTIVE INTERPOSER DIES FOR STACKED SILICON INTERCONNECT TECHNOLOGY (SSIT) DEVICES

FIELD

An embodiment described herein relates generally to assembly of stacked silicon interconnect technology (SSIT) devices, and in particular to a method for removing bumps on incomplete interposer die(s) and/or defective interposer die(s) for SSIT devices.

BACKGROUND

In stacked silicon interconnect technology (SSIT) devices, adjacent semiconductor dies (e.g., FPGA dies) are connected through an interposer. Each semiconductor die may have its own separate functionality, and semiconductor dies making up the SSIT device may be coupled together through the interposer. Electrical connections between semiconductor dies and interposer are formed using bumps (e.g., microbumps) that are very close in proximity (e.g., 45 μm between bumps).

Assembly of semiconductor dies and the interposer is typically performed at a wafer level. In other words, processing of several interposer dies making up an interposer wafer may be performed together for assembly of those interposer dies with corresponding semiconductor dies. The interposer wafer may include several complete interposer die as well as incomplete interposer die (e.g., edge dies). The complete interposer dies that have been tested and meet a standard of quality (e.g., good interposer dies) are populated with semiconductor dies, while incomplete dies (e.g., edge dies) and defective complete dies (e.g., bad interposer dies) are not populated with semiconductor dies.

During fabrication of the interposer wafer, bumps are formed on the entirety of the interposer wafer, including incomplete interposer dies and defective interposer dies. This is done in order to ensure bump uniformity and optimal bump density across the wafer and to promote effective current density, among other reasons. However, not all of the bumps formed on the interposer wafer are used to populate interposer dies or defective interposer dies are not populated with semiconductor dies and may become dislodged and trapped between bumps used to populate semiconductor dies, causing shorts and other reliability problems.

SUMMARY

A method for removing bumps from incomplete interposer die(s) and/or defective interposer die(s) of an interposer wafer, includes: forming bumps on an interposer wafer; identifying at least one incomplete interposer die and/or at least one defective interposer die of the interposer wafer; and removing bumps from the at least one incomplete interposer die and/or the at least one defective interposer die of the interposer wafer.

Optionally, the act of forming bumps on the interposer wafer comprises: performing under bump metallization on the interposer wafer to form an under bump metal layer on the interposer wafer; forming a first photoresist layer on the under bump metal layer; plating bumps on the under bump metal layer using the first photoresist layer; and stripping the first photoresist layer.

Optionally, the first photoresist layer is formed using a positive photoresist material.

Optionally, the act of removing bumps from the at least one incomplete interposer die and/or the at least one defective interposer die of the interposer wafer, comprises: forming a second photoresist layer to protect bumps corresponding to interposer dies of the interposer wafer that are to be populated with semiconductor dies; etching bumps corresponding to the identified at least one incomplete interposer die and/or at least one defective interposer die of the interposer wafer; and stripping the second photoresist layer.

Optionally, the method further includes: etching the under bump metal layer; performing reflow joining on the interposer wafer; and cleaning the interposer wafer.

Optionally, the act of removing bumps from the at least one incomplete interposer die and/or the at least one defective interposer die of the interposer wafer, comprises: forming a second photoresist layer to protect bumps corresponding to the identified at least one incomplete interposer die and/or at least one defective interposer die of the interposer wafer; etching a portion of the under bump metal layer situated on interposer dies of the interposer wafer that are to be populated with semiconductor dies; stripping the second photoresist layer; forming a third photoresist layer to protect bumps corresponding to the interposer dies of the interposer wafer that are to be populated with semiconductor dies; etching bumps corresponding to the identified at least one incomplete interposer die and/or at least one defective interposer die of the interposer wafer; and stripping the third photoresist layer.

Optionally, the method further includes: performing reflow joining on the interposer wafer; and cleaning the interposer wafer.

Optionally, the under bump metal layer comprises multiple metal layers.

Optionally, the act of forming the first photoresist layer on the under bump metal layer comprises forming openings in the first photoresist layer where the bumps are to be plated.

Optionally, the act of plating the bumps on the under bump metal layer comprises forming one or more metal layers and a solder layer.

Optionally, the method further includes: populating good interposer dies of the interposer wafer with semiconductor dies.

Optionally, the interposer wafer is a reconstituted wafer.

A method for removing bumps from incomplete interposer die(s) and/or defective interposer die(s) of an interposer wafer, includes: forming bumps on the interposer wafer; identifying at least one incomplete interposer die and/or at least one defective interposer die of the interposer wafer; forming a first photoresist layer to protect bumps corresponding to interposer dies of the interposer wafer that are to be populated with semiconductor dies; etching bumps corresponding to the identified at least one incomplete interposer die and/or at least one defective interposer die of the interposer wafer; and stripping the first photoresist layer.

Optionally, the act of forming bumps on the interposer wafer comprises: performing under bump metallization on the interposer wafer to form an under bump metal layer on the interposer wafer; forming a second photoresist layer on the under bump metal layer; plating bumps on the under bump metal layer using the second photoresist layer; and stripping the second photoresist layer.

Optionally, the method further includes: etching the under bump metal layer; performing reflow joining on the interposer wafer; and cleaning the interposer wafer.

Optionally, the under bump metal layer comprises multiple metal layers.

Optionally, the act of forming the second photoresist layer on the under bump metal layer comprises forming openings in the second photoresist layer where the bumps on the under bump metal layer are to be plated.

Optionally, the act of plating the bumps on the under bump metal layer comprises forming one or more metal layers and a solder layer.

Optionally, the method further includes: populating good interposer dies of the interposer wafer with semiconductor dies.

Optionally, the interposer wafer is a reconstituted wafer.

Optionally, the interposer wafer may include one or more active dies.

Other features will be described in the detailed description.

BRIEF DESCRIPTION OF THE DRAWINGS

The drawings illustrate the design and utility of various features described herein, in which similar elements are referred to by common reference numerals. These drawings are not necessarily drawn to scale. In order to better appreciate how the above-recited and other advantages and objects are obtained, a more particular description will be rendered, which are illustrated in the accompanying drawings. These drawings depict only exemplary features and are not therefore to be considered limiting in the scope of the claims.

FIGS. 3-1 to 3-6 are schematic diagrams illustrating a method for forming bumps on an interposer wafer.

FIGS. 4-1 to 4-3 are schematic diagrams illustrating the interposer wafer being populated with semiconductor dies.

FIG. 5 is a flow diagram illustrating a method for removing bumps from interposer dies that are not used to populate semiconductor dies during fabrication of an SSIT device according to some embodiments.

FIG. 6 is a flow diagram illustrating a method for removing bumps from interposer dies that are not used to populate semiconductor dies during fabrication of an SSIT device according to some embodiments.

FIGS. 7-1 to 7-9 are schematic diagrams illustrating the method of FIG. 6 for removing bumps from interposer dies that are not used to populate semiconductor dies during fabrication of an SSIT device according to some embodiments.

FIG. 8 is a flow diagram illustrating an alternative method for removing bumps from interposer dies that are not used to populate semiconductor dies during fabrication of an SSIT device according to some embodiments.

FIGS. 9-1 to 9-11 are schematic diagrams illustrating the alternative method of FIG. 8 for removing bumps from interposer dies that are not used to populate semiconductor dies during fabrication of an SSIT device according to some embodiments.

FIGS. 10-1 to 10-2 are schematic diagrams illustrating the interposer wafer being populated with semiconductor dies after removing bumps that are not used to populate semiconductor dies during fabrication.

DETAILED DESCRIPTION

Figure 1:
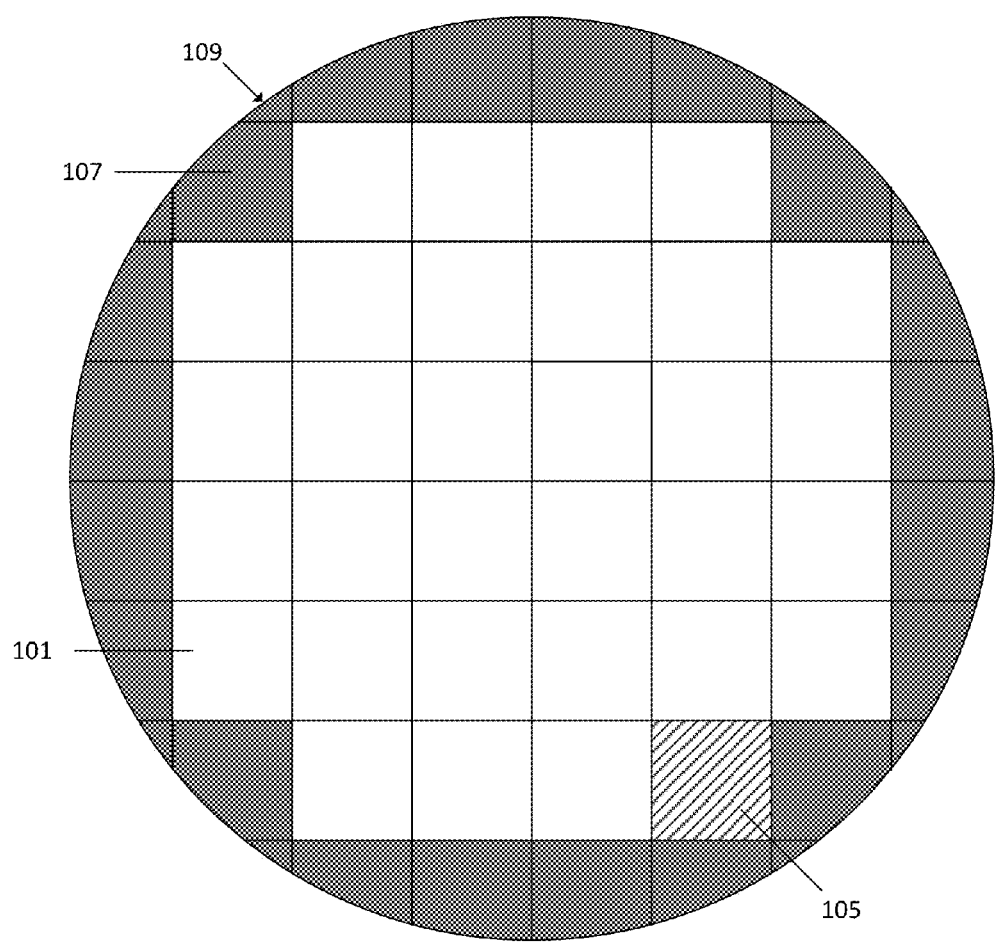
FIG. 1 is a top-view diagram of an interposer wafer populated with semiconductor dies.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

Embodiments described herein provide a method for removing bumps from incomplete and/or defective interposer die(s) of an interposer wafer. As used in this specification, the term "incomplete and/or defective interposer die(s)", or similar terms, may refer to one or more incomplete interposer die(s), one or more defective interposer die(s), or the combination of incomplete interposer die(s) and defective interposer die(s). Initially, bumps are formed on an interposer wafer having several interposer dies, which may include incomplete die(s) and/or defective interposer die(s). The incomplete interposer die(s) and/or defective interposer die (s) is then identified, and bumps situated on the incomplete interposer die(s) and/or defective interposer die(s) are removed. The good interposer die(s) may then be populated with semiconductor dies (e.g., FPGA dies).

By removing bumps situated on the incomplete interposer die(s) and/or defective interposer die(s) of the interposer wafer prior to populating the good interposer die(s) with semiconductor dies, those bumps no longer become dislodged and trapped between bumps situated on good interposer die(s), thereby eliminating shorts and other reliability problems.

In stacked silicon interconnect technology (SSIT) devices, adjacent semiconductor dies (e.g., FPGA dies) are connected through an interposer die. Each semiconductor die may have its own separate functionality, and semiconductor dies making up the SSIT device may be coupled together through the interposer die. Electrical connections between semiconductor dies and interposer dies are formed using bumps (e.g., microbumps) that are very close in proximity (e.g., 45 μm between bumps).

Assembly of semiconductor dies and the interposer dies is typically performed at a wafer level. In other words, processing of several interposer dies making up an interposer wafer may be performed together for assembly of those interposer dies with corresponding semiconductor dies to form SSIT devices. Optionally, an interposer wafer may include one or more active dies having one or more active elements. An example of such an assembled product is illustrated in FIG. 1. FIG. 1 is a top-view diagram of an interposer wafer having several interposer dies populated with semiconductor dies. The interposer wafer 109 may include several complete interposer dies as well as incomplete interposer dies (e.g., edge interposer dies) 107. The complete interposer dies that have been tested and meet a standard of quality (e.g., good interposer dies) are populated with semiconductor dies 101. The incomplete interposer dies 107 (e.g., edge dies) and defective complete interposer dies 105 (e.g., bad interposer dies) are not populated with semiconductor dies 101, and are illustrated in FIG. 1. The defective complete interposer die 105 is depicted by the striped pattern.

During fabrication of the interposer wafer 109, bumps are formed on the entirety of the interposer wafer 109, including incomplete interposer dies 107 and defective interposer dies 105. This is done in order to ensure optimal bump uniformity and bump density across the interposer wafer 109 and to promote effective current density, among other reasons. However, not all of the bumps formed on the interposer wafer 109 are used to populate interposer dies with semiconductor dies 101. The bumps that reside on incomplete interposer die(s) 107 and/or defective complete interposer die(s) 105 are not populated with semiconductor dies 101 and may become dislodged and trapped between bumps situated on good interposer dies (not shown) that are populated with semiconductor dies 101, causing shorts and other reliability problems.

Figure 2:
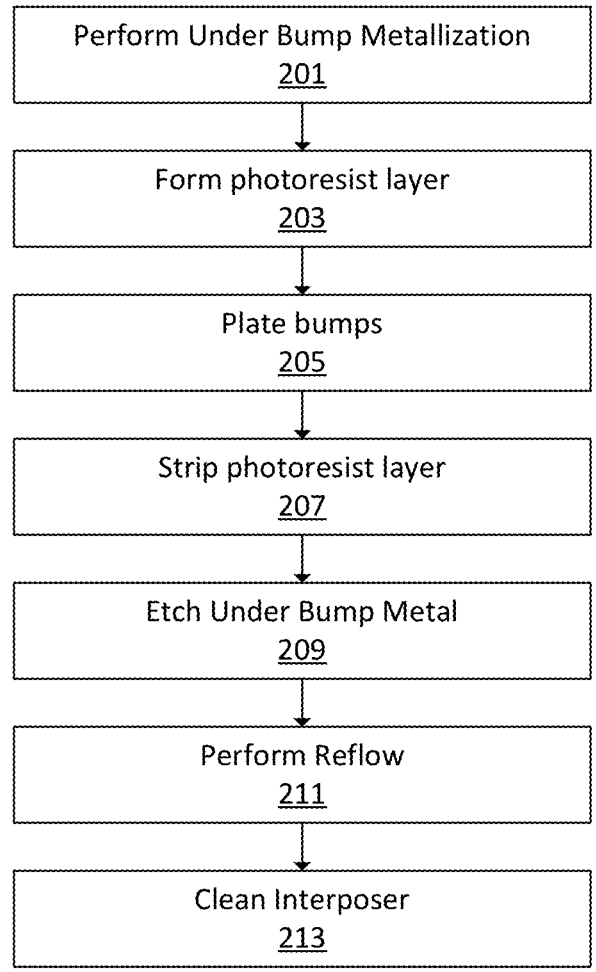
FIG. 2 is a flow diagram illustrating a method for forming bumps on an interposer wafer.

FIG. 2 is a flow diagram illustrating a method for forming bumps on an interposer wafer. The flow diagram of FIG. 2 should be viewed in conjunction with FIGS. 3-1 to 3-6 which are cross-sectional schematic diagrams illustrating the method for fabricating bumps on an interposer wafer.

Figures 1, 3:
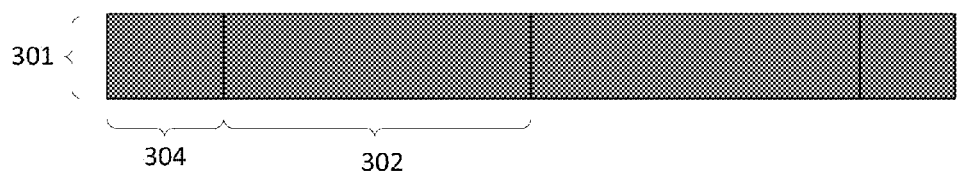
Figures 2, 3:
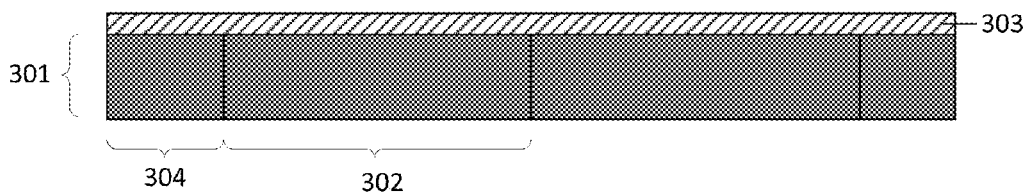
Figure 3:
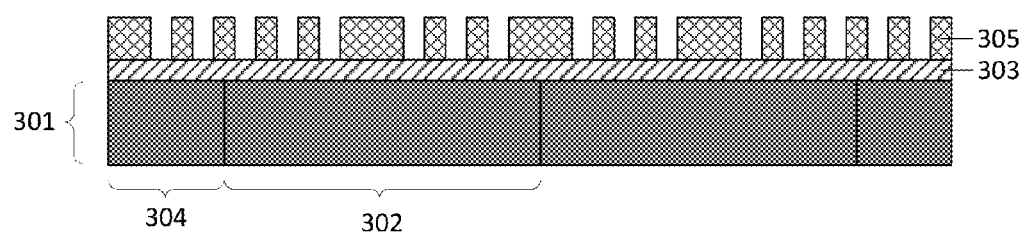

Initially an interposer wafer 301 is received as illustrated in FIG. 3-1. The interposer wafer 301 includes complete interposer die(s) 302 as well as incomplete interposer die(s) 304. The complete interposer die(s) 302 of the interposer wafer 301 may include various routing layer configurations and through-silicon-vias (TSVs), which are not shown for purposes of simplicity, to allow for semiconductor dies that are subsequently populated on the complete interposer die(s) 302 of the interposer wafer 301 to form electrical connections with each other.

Under bump metallization of the interposer wafer is then performed to form an under bump metal layer on the interposer wafer as shown at 201. FIG. 3-2 depicts the under bump metal layer 303 formed on the interposer wafer 301. Under bump metallization may involve sputtering a base/seed layer on the interposer wafer 301 and building several metal layers above the base/seed layer to form the under bump metal layer 303 on the interposer wafer 301. Although the under bump metal layer 303 may include several different metal layers, only a single metal layer is depicted for purposes of simplicity.

After the under bump metal layer is formed on the interposer wafer, a photoresist layer is formed on the under bump metal layer as shown at 203 in FIG. 2. FIG. 3-3 depicts the photoresist layer 305 formed on the under bump metal layer 303. The photoresist layer 305 may include several openings where bumps are to be subsequently plated.

Figures 3, 4:
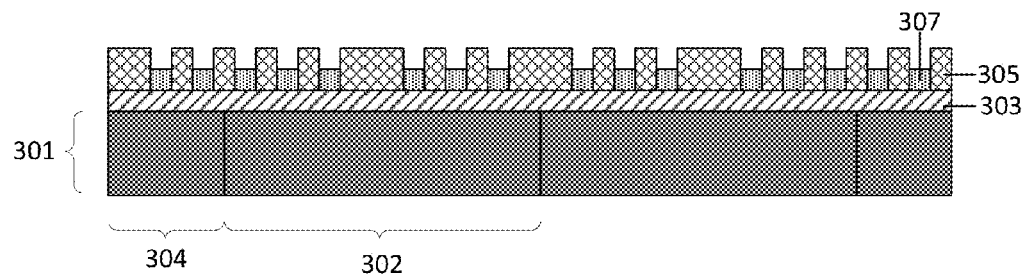

Bumps are then plated using the photoresist layer as shown at 205 in FIG. 2. FIG. 3-4 depicts the bumps 307 after plating using the photoresist layer 305. Plating the bumps 307 may involve forming one or more metal layers and a solder layer. The bumps 307 are used to subsequently populate the complete interposer die(s) 302 with semiconductor die(s). The bumps 307 are coupled to corresponding bumps on the semiconductor dies to allow for electrical connections to be made between the semiconductor die(s) and the complete interposer die(s) 302.

Although only the complete interposer die(s) 302 will be subsequently populated with semiconductor dies, both the complete and incomplete interposer dies 304 are plated with bumps in order to ensure bump uniformity and optimal bump density across the interposer wafer 301 to promote effective current density, among other reasons.

Figures 3, 4, 5:
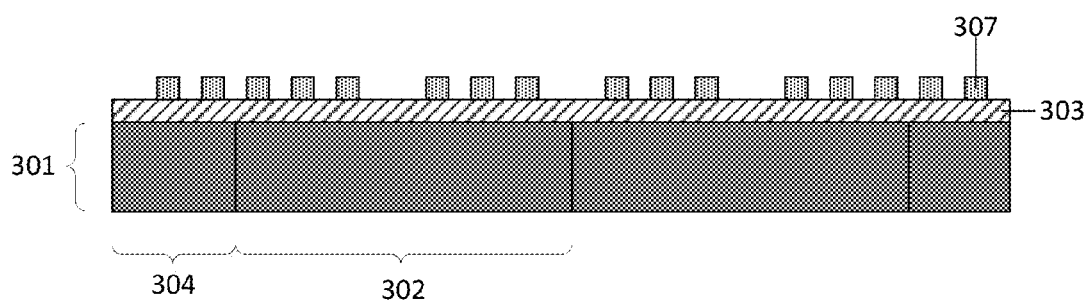

After the bumps have been plated, the photo resist layer is stripped as shown at 207 in FIG. 2. FIG. 3-5 depicts the resulting structure after the photoresist layer has been stripped. The resulting structure includes the interposer wafer 301, under bump metal layer 303 and plated bumps 307.

Etching of the under bump metal layer is then performed as shown at 209 in FIG. 2. The etch of the under bump metal layer may be followed by reflow joining as shown at 211 and interposer wafer cleaning as shown at 213. Etching of the under bump metal layer is performed in order to remove portions of the under bump metal layer that are not populated with bumps. Reflow joining is performed at the interposer wafer to effectively join the bump with the under bump metal layer. Cleaning is performed to remove any residue resulting from fabrication of the interposer wafer. FIG. 3-6 depicts the resulting structure after etching of the under bump metal layer 303, reflow joining, and cleaning are performed.

The method for forming bumps on an interposer wafer depicted in FIG. 2 and FIGS. 3-1 to 3-6 results in bumps being formed on incomplete interposer dies. During assembly and post processing steps, when the complete interposer dies are populated with respective semiconductor dies, the bumps and/or their corresponding portions of the under bump layer formed on the incomplete interposer dies may become dislodged and trapped between bumps formed on the complete interposer dies, leading to shorts and other reliability issues.

FIGS. 4-1 to 4-3 are schematic diagrams illustrating the interposer wafer being populated with semiconductor dies. As illustrated in FIG. 4-1, the semiconductor dies 401 include complementary bumps 407 and a complementary under bump metal layer 403 that are used for electrically connecting the semiconductor dies 401 to the respective complete interposer dies 302.

Various process steps may be performed to couple the bumps 407 and under bump metal layer 403 of the semiconductor dies 401 with the bumps 307 and under bump metal layer 303 of the complete interposer wafer dies 302. Only complete interposer wafer dies 302 are populated with semiconductor dies 401. Incomplete interposer wafer dies 304 are not populated with semiconductor dies 401. FIG. 4-2 depicts the resulting SSIT devices after the complete interposer dies 302 are populated with respective semiconductor dies 401.

During post-processing and assembly of the SSIT devices, the bumps 307 and/or their corresponding portions of the under bump metal layer 303 formed on the incomplete interposer dies 304 may become dislodged and trapped between bumps 307 and/or their corresponding portions of the under bump metal layer 303 formed on the complete interposer dies 302 as depicted in FIG. 4-3. This may lead to shorting of the SSIT devices as well as other reliability issues. Additional processing steps may then have to be taken in order to identify shorts and to remove those shorts from SSIT devices, leading to additional processing time, complexity and costs.

Although FIGS. 4-1 to 4-3 only illustrate bumps and/or corresponding portions of under bump metal layers formed on incomplete interposer dies becoming dislodged, it is important to note that bumps and/or corresponding portions of under bump metal layers formed on defective interposer dies which are not populated with semiconductor dies may also become dislodged causing the same reliability problems as described above.

FIG. 5 is a flow diagram illustrating a method for removing bumps from interposer dies that are not used to populate semiconductor dies during fabrication of an SSIT device according to some embodiments.

Initially, bumps are formed on an interposer wafer as shown at 501. Bumps may be formed on the entire interposer wafer, including complete interposer dies, interposer dies that may be defective and incomplete interposer dies. Forming bumps on the entire interposer wafer ensures bump uniformity and optimal bump density across the interposer wafer and promotes effective current density, among other reasons. Various fabrication steps may be used to form bumps on the interposer wafer and additional details pertaining to the formation of bumps on the interposer wafer will be described below.

In some embodiments, the interposer wafer may be formed from the same substrate. In other embodiments, the interposer wafer may be a reconstituted interposer wafer that is made up of incomplete interposer dies and known good interposer dies that may originate from different substrates.

After bumps are formed on the interposer wafer, incomplete interposer die(s) and/or defective interposer die(s) of the interposer wafer are identified as shown at 503. Identifying incomplete interposer die(s) and/or defective interposer die(s) allows for bumps formed on the incomplete interposer die(s) and/or defective interposer die(s) to be removed such that they are not subsequently dislodged to cause potential shorts and other reliability issues.

Identifying incomplete interposer dies may involve simply locating edge dies on the interposer wafer that are known to not be later populated with semiconductor dies. Identifying defective interposer dies may involve running reliability and quality control tests on the complete interposer dies to determine which complete interposer dies fail to meet a standard of quality.

Once the incomplete interposer die(s) and/or defective interposer die(s) have been identified, bumps formed on the incomplete interposer die(s) and/or defective interposer die(s) may be removed as shown at 505. Removing bumps formed on the incomplete and defective interposer dies ensures that those bumps will not be subsequently dislodged to cause potential shorts and other reliability issues for SSIT devices formed using the good interposer dies. Various fabrication steps may be used to remove bumps formed on the incomplete and defective interposer dies, and additional details regarding the removal of bumps formed on the incomplete and defective interposer dies will be described below.

Figures 3, 4, 5, 6:
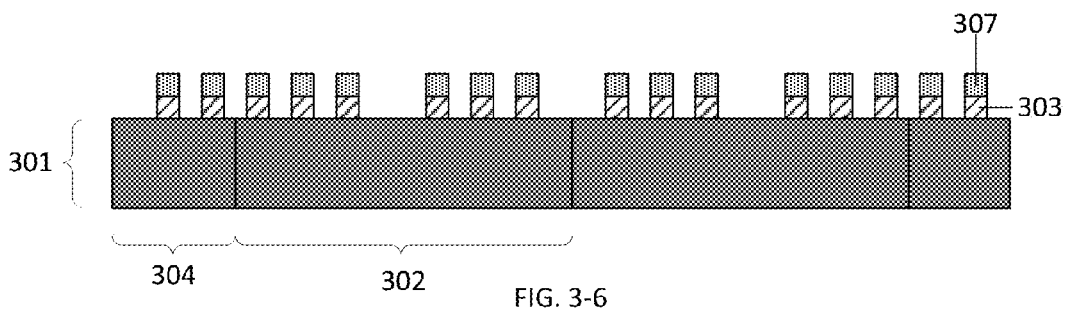
Figures 1, 4:
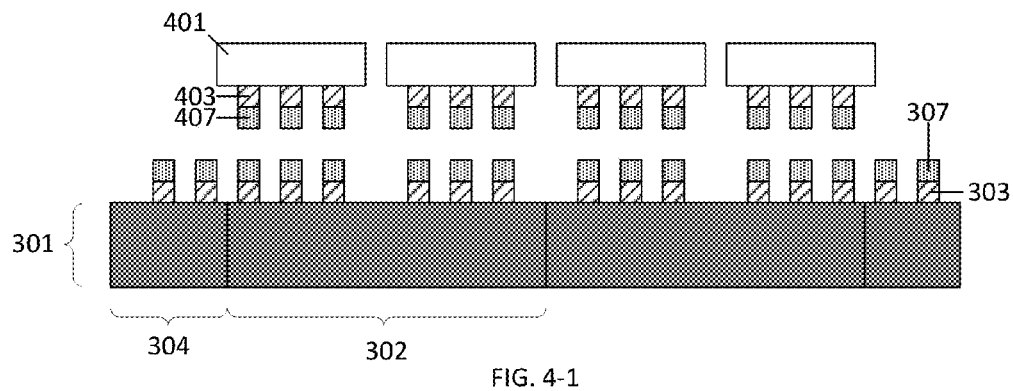
Figures 2, 4:
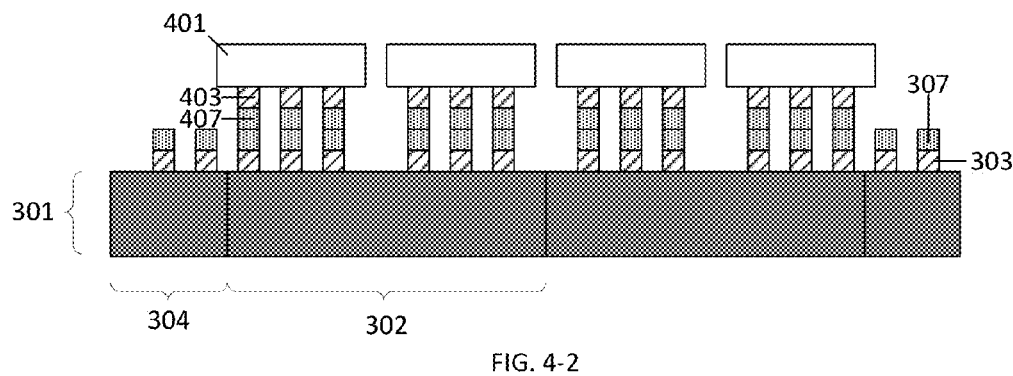
Figures 3, 4:
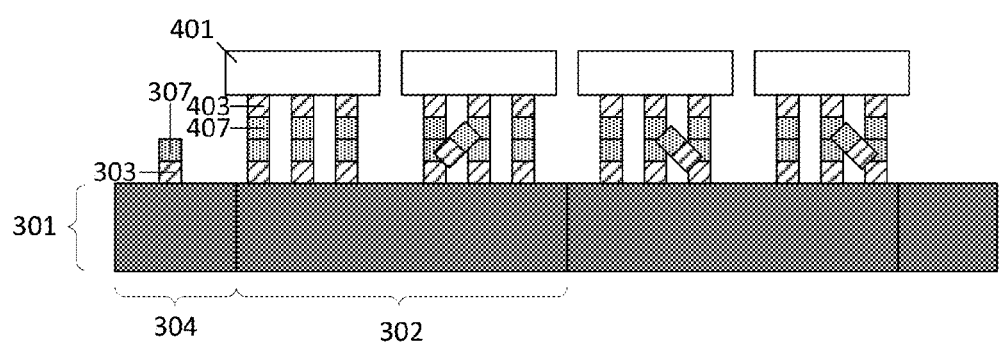
Figure 5:
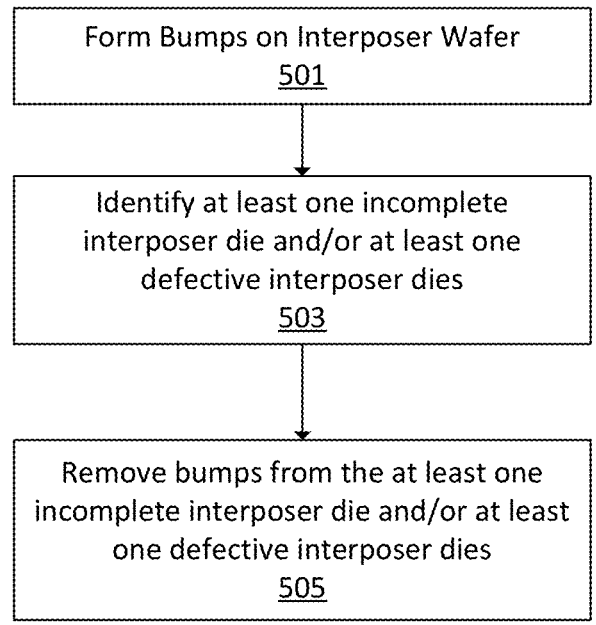
Figure 6:
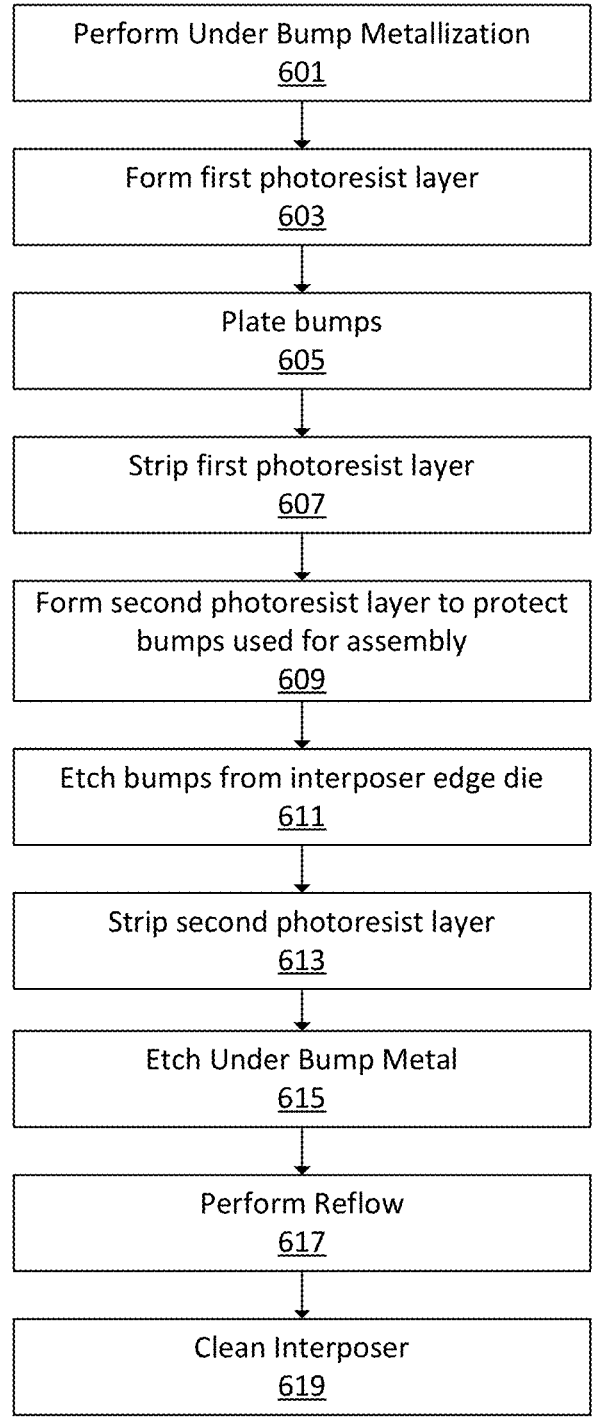

FIG. 6 is a flow diagram illustrating a method for removing bumps from interposer dies that are not used to populate semiconductor dies during fabrication of an SSIT device according to some embodiments. The flow diagram of FIG. 6 should be viewed in conjunction with FIGS. 7-1 to 7-9 which are schematic diagrams illustrating the method for removing bumps from interposer dies that are not used to populate semiconductor dies.

Figures 1, 7:
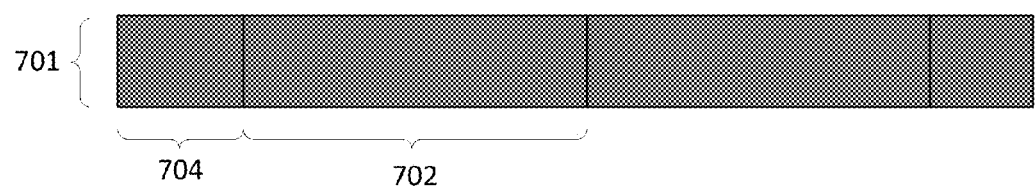
Figures 2, 7:
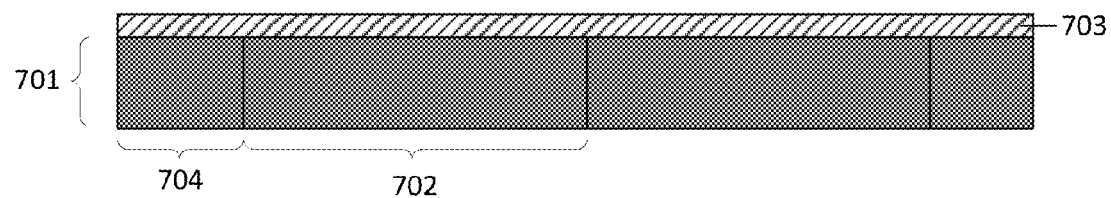
Figures 3, 7:
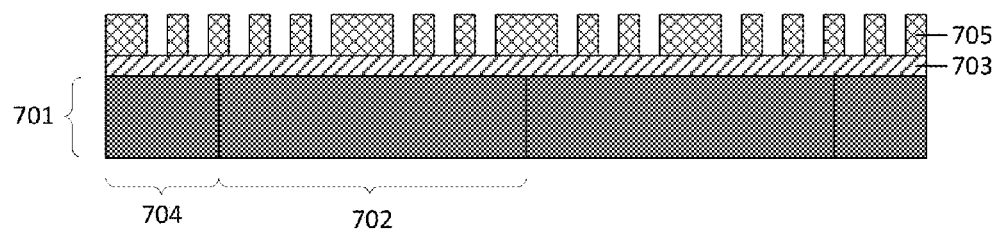
Figures 4, 7:
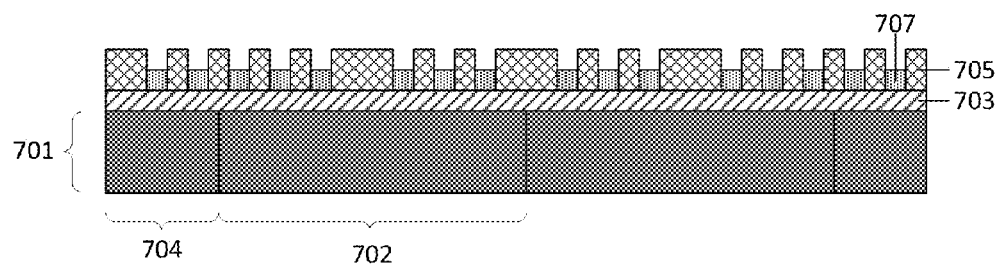
Figures 5, 7:
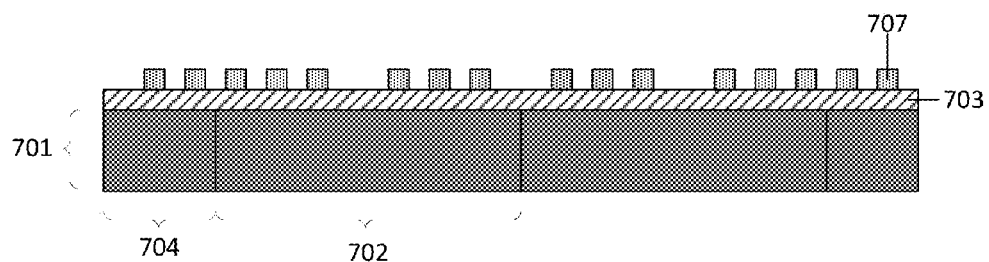
Figures 6, 7:
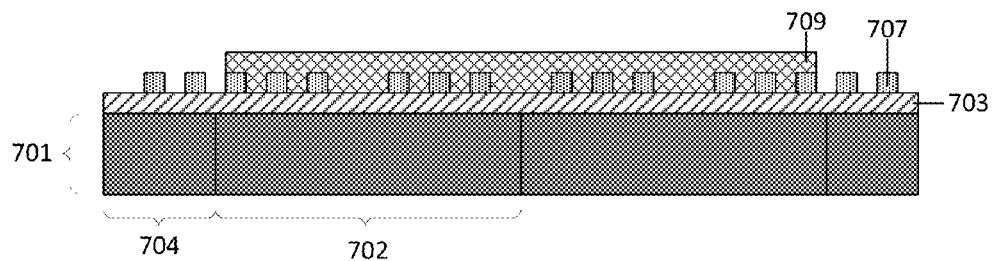
Figure 7:
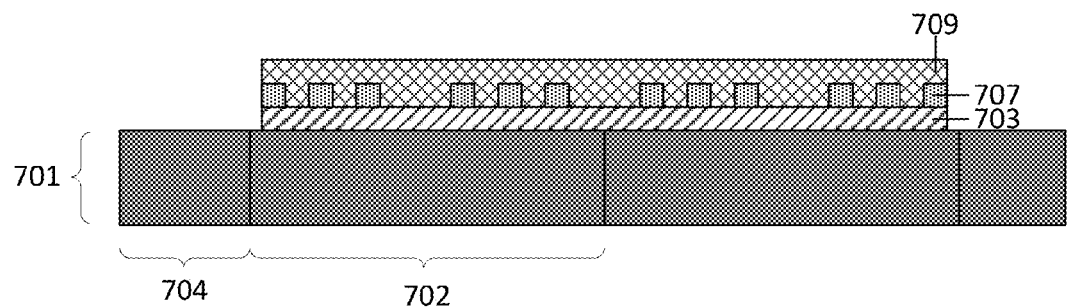

Initially an interposer wafer 701 is received as illustrated in FIG. 7-1. The interposer wafer 701 includes complete interposer dies 702 as well as incomplete interposer dies 704. As mentioned above, the interposer wafer 701 be formed from the same substrate or may instead be a reconstituted interposer wafer that is made up of incomplete interposer dies and known good interposer dies that may originate from different substrates.

The complete interposer dies 702 of the interposer wafer 701 may include various routing layer configurations and through-silicon-vias (TSVs), which are not shown for purposes of simplicity, to allow for semiconductor dies that are subsequently populated on the complete interposer dies 702 of the interposer wafer 701 to form electrical connections with each other.

Under bump metallization of the interposer wafer is then performed to form an under bump metal layer on the interposer wafer as shown at 601 in FIG. 6. FIG. 7-2 depicts the under bump metal layer 703 formed on the interposer wafer 701. Although the under bump metal layer 703 may include several different metal layers, only a single metal layer is depicted for purposes of simplicity.

Under bump metallization may involve sputtering a base/seed layer on the interposer wafer 701 and building additional metal layers above the base/seed layer to form the under bump metal layer 703 on the interposer wafer 701. The metal layers may also be formed by performing a sputtering process.

In some embodiments, the under bump metal layer 703 may include a titanium (Ti) layer and a copper (Cu) layer. The tin (Ti) layer may have a thickness between 1000 and 4000 Angstroms and the Copper (Cu) may also have a thickness between 1000 and 4000 Angstroms. In other embodiments, the under bump metal layer 703 may include a titanium/tungsten (TiW) layer and a copper (Cu) layer, with the titanium tungsten (TiW) layer having a thickness between 1000 and 4000 Angstroms and the copper layer (Cu) having a thickness between 10000 and 4000 Angstroms.

After the under bump metal layer is formed on the interposer wafer, a first photoresist layer is formed on the under bump metal layer as shown at 603 in FIG. 6. FIG. 7-3 depicts the first photoresist layer 705 formed on the under bump metal layer 703. The first photoresist layer 705 may include several openings where bumps are to be subsequently plated.

In some embodiments, the first photo resist layer 705 may be formed by depositing photoresist material and patterning the photoresist material such that it includes the openings for where bumps are to be subsequently plated. The photoresist material may be patterned by aligning a mask having the desired pattern with the photoresist material, exposing the photoresist material using the mask, and etching the photoresist material such that the exposed portions or unexposed portions are removed to form the desired pattern is formed. Examples of photoresist material include aqueous solutions of organic amine such as tetramethyl ammonium hydroxide (TMAH) or an inorganic salt such as potassium hydroxide.

The photoresist material may be positive or negative and UV radiation may be used to expose the photoresist material. Where the photoresist material is a positive photoresist material, the portions of the photoresist material exposed to UV radiation may be subsequently etched, while the unexposed portions of the photoresist material remain intact after the etching process. Where the photoresist material is a negative photoresist material, the portions of the photoresist material exposed to UV radiation may remain intact after the etching process, while the unexposed portions of the photoresist material may be subsequently etched.

Bumps are then plated using the photoresist layer as shown at 605 in FIG. 6. FIG. 7-4 depicts the bumps 707 after plating using the photoresist layer 705. Plating the bumps 707 may involve forming one or more metal layers and a solder layer, which are not illustrated for purposes of simplicity. In some embodiments, plating the bumps may involve first forming a copper pillar bump having a height between 10 and 25 μm followed by forming solder composed of Tin/Aluminum (Sn/Ag) and having a height between 10 and 15 μm on the copper pillar bump. Together the copper pillar bump and solder form the plated bump.

The bumps 707 are used to subsequently populate the complete interposer dies 702 with respective semiconductor dies. The bumps 707 are to be coupled with corresponding bumps on the semiconductor dies to allow for electrical connections to be made between the semiconductor dies and the complete interposer dies 702.

Although only the complete interposer dies 702 will be subsequently populated with semiconductor dies, both the complete and incomplete interposer dies 704 are plated with bumps in order to ensure bump uniformity and optimal bump density across the interposer wafer 701 to promote effective current density, among other reasons.

After the bumps have been plated, the first photo resist layer is stripped as shown at 607 in FIG. 6. FIG. 7-5 depicts the resulting structure after the first photoresist layer 705 has been stripped. The resulting structure includes the interposer wafer 701, under bump metal layer 703 and plated bumps 707.

In some embodiments, the first photo resist layer 705 may be stripped using a chemical compound such a 1-Methyl-2- pyrrolidon (NMP), Acetone, Dimethyl sulfoxide (DMSO) or aqueous alkaline solutions such as 2-3% Potassium Hydroxide (KOH) or Sodium Hydroxide (NaOH). Such chemical compounds allow for the first photo resist layer 705 to be stripped without stripping away the plated bumps 707 and the under bump metal layer 703. Other techniques for stripping the first photo resist layer 705 may be used.

A second photoresist layer is then formed to protect the bumps and their corresponding portions of under bump metal layer formed on the complete interposer dies as shown at 609 in FIG. 6. FIG. 7-6 depicts the resulting structure after the second photoresist layer 709 is formed. FIG. 7-6 depicts the second photoresist layer 709 being formed to protect the bumps 707 and their corresponding portions of under bump metal layer 703 formed on all the complete interposer dies 702 of the interposer wafer 701. However, it is important to note that where defective complete interposer dies exist in the interposer wafer 701, the second photoresist layer 709 is not formed to protect those defective complete interposer dies.

In some embodiments, the second photo resist layer 709 may be formed by depositing photoresist material and patterning the photoresist material such that it covers the bumps formed on good interposer dies and exposes the bumps formed on incomplete interposer dies and defective complete interposer dies. The photoresist material may be patterned by aligning a mask having the desired pattern with the photoresist material, exposing the photoresist material using the mask, and etching the photoresist material such that the exposed portions or unexposed portions are removed to form the desired pattern. The second photo resist layer 709 may be formed using the same techniques used to form the first photoresist layer 705, and as such will be not be described again in detail. In other embodiments, the second photo resist layer 709 may be formed using a different technique from that used to form the first photoresist layer 705.

Etching of the bumps formed on the incomplete interposer dies and/or complete defective interposer dies is then performed as shown at 611 in FIG. 6. FIG. 7-7 depicts the resulting structure after etching of the bumps formed on the incomplete interposer dies is performed. FIG. 7-7 depicts the removal of bumps formed on incomplete interposer dies. However, it is important to note that where defective complete interposer dies exist in the interposer wafer 701, the etch may also remove bumps formed on those defective complete interposer dies.

The etching of bumps 707 formed on the incomplete and defective interposer dies may also include etching portions of the under bump metal layer 703 formed on those incomplete and defective interposer dies. Various chemical processes may be used to etch the bumps 707 and portions of the under bump metal layer 703 formed on the incomplete interposer or defective interposer dies. For example, a sulfuric peroxide solution may be used to etch copper (Cu) while a hydrogen peroxide or hydrogen fluoride solution may be used to etch titanium (Ti).

Figures 7, 8:
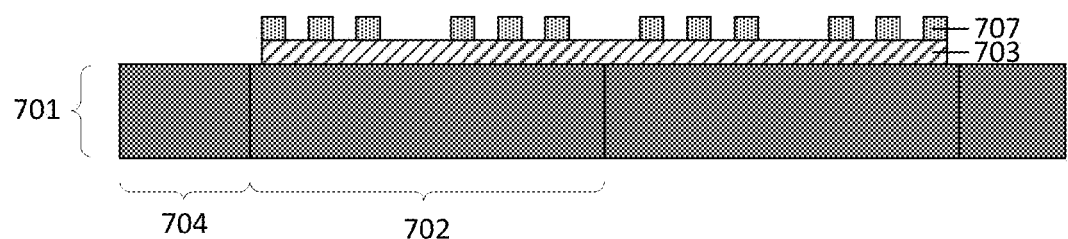

After the bumps formed on the incomplete and defective interposer dies and their corresponding portions of under bump metal layer have been etched, the second photo resist layer is stripped as shown at 613 in FIG. 6. FIG. 7-8 depicts the resulting structure after the second photoresist layer 709 has been stripped. Stripping of the second photoresist layer 709 may be accomplished in the same manner as the first photoresist layer 705. The resulting structure includes the interposer wafer 701, the portion of the under bump metal layer 703 formed over good interposer dies and plated bumps 707 formed on good interposer dies.

Etching of the remaining under bump metal layer is then performed as shown at 615 in FIG. 6. The etch of the remaining under bump metal layer may be followed by reflow joining as shown at 617 and interposer wafer cleaning as shown at 619.

Etching of the under bump metal layer is performed in order to remove portions of the under bump metal layer that are not populated with bumps. Various chemical processes may be used to etch the under bump metal layer. For example, a sulfuric peroxide solution may be used to etch copper (Cu) while a hydrogen peroxide or hydrogen fluoride solution may be used to etch titanium (Ti).

Reflow joining is then performed to effectively join the bump with the under bump metal layer.

Cleaning is performed to remove any residue resulting from processing of the interposer wafer. In some embodiments cleaning may be performed using deionized (DI) water. In other embodiments, cleaning may be performed using various chemicals including acetone, alcohol, or other alkaline reagents.

Figures 7, 8, 9:
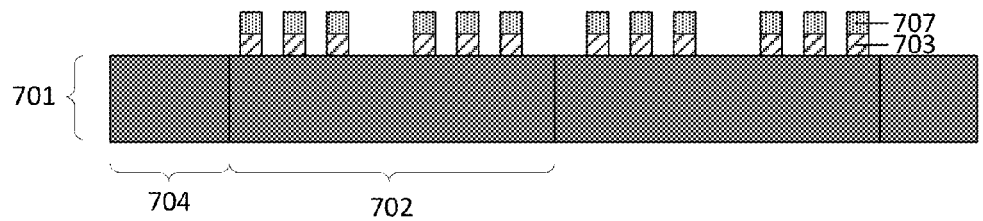
Figure 8:
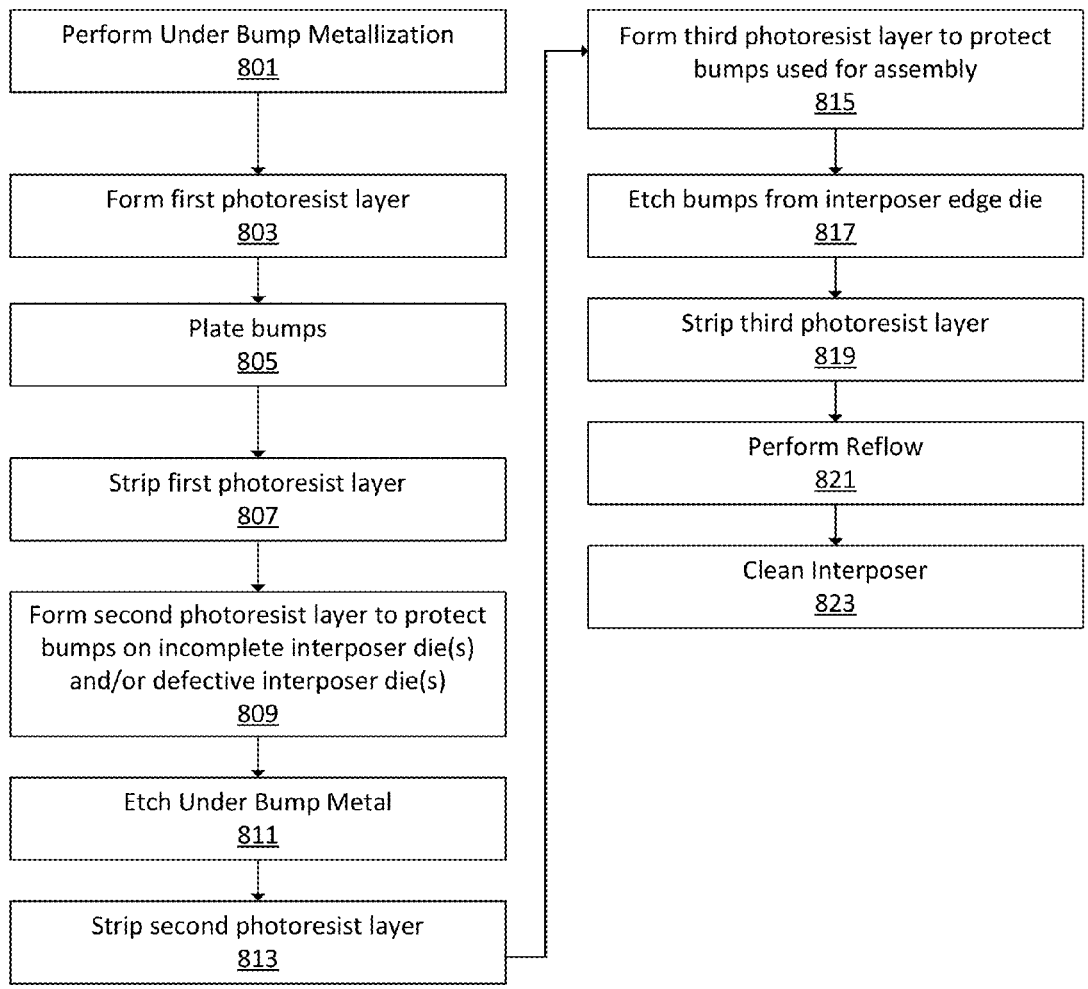

FIG. 7-9 depicts the resulting structure after etching of the under bump metal layer, reflow joining, and cleaning are performed. The resulting structure includes bumps 707 and corresponding portions of under metal layer 703 formed only on the good interposer dies.

FIG. 8 is a flow diagram illustrating an alternative method for removing bumps from interposer dies that are not used to populate semiconductor dies during fabrication of an SSIT device according to some embodiments. The flow diagram of FIG. 8 should be viewed in conjunction with FIGS. 9-1 to 9-11 which are schematic diagrams illustrating the alternative method for removing bumps from interposer dies that are not used to populate semiconductor dies during fabrication of an SSIT device.

Initially an interposer wafer 901 is received as illustrated in FIG. 9-1. The interposer wafer 901 includes complete interposer dies 902 as well as incomplete interposer dies 904. The complete interposer dies 902 of the interposer wafer 901 may include various routing layer configurations and through-silicon-vias (TSVs), which are not shown for purposes of simplicity, to allow for semiconductor dies that are subsequently populated on the complete interposer dies 902 of the interposer wafer 901 to form electrical connections with each other.

Under bump metallization of the interposer wafer is then performed to form an under bump metal layer on the interposer wafer as shown at 801 in FIG. 8. FIG. 9-2 depicts the under bump metal layer 903 formed on the interposer wafer 901. Although the under bump metal layer 903 may include several different metal layers, only a single metal layer is depicted for purposes of simplicity.

Under bump metallization may involve sputtering a base/seed layer on the interposer wafer 901 and building additional metal layers above the base/seed layer to form the under bump metal layer 903 on the interposer wafer 901. The additional metal layers may also be formed by performing a sputtering process.

In some embodiments, the under bump metal layer 903 may include a titanium (Ti) layer and a copper (Cu) layer. The tin (Ti) layer may have a thickness between 1000 and 4000 Angstroms and the Copper (Cu) may also have a thickness between 1000 and 4000 Angstroms. In other embodiments, the under bump metal layer 703 may include a titanium/tungsten (TiW) layer and a copper (Cu) layer, with the titanium tungsten (TiW) layer having a thickness between 1000 and 4000 Angstroms and the copper layer (Cu) having a thickness between 10000 and 4000 Angstroms.

After the under bump metal layer is formed on the interposer wafer, a first photoresist layer is formed on the under bump metal layer as shown at 803 in FIG. 8. FIG. 9-3 depicts the first photoresist layer 905 formed on the under bump metal layer 903. The first photoresist layer 905 may include several openings where bumps are to be subsequently plated.

In some embodiments, the first photo resist layer 905 may be formed by depositing photoresist material and patterning the photoresist material such that it includes the openings for where bumps are to be subsequently plated. The photoresist material may be patterned by aligning a mask having the desired pattern with the photoresist material, exposing the photoresist material using the mask, and etching the photoresist material such that the exposed portions or unexposed portions are removed to form the desired pattern. Examples of photoresist material include aqueous solutions of organic amine such as tetramethyl ammonium hydroxide (TMAH) or an inorganic salt such as potassium hydroxide. Other techniques for forming the first photo resist layer 905 may be used.

The photoresist material may be a positive or negative and UV radiation may be used to expose the photoresist material. Where the photoresist material is a positive photoresist material, the portions of the photoresist material exposed to UV radiation may be subsequently etched, while the unexposed portions of the photoresist material remain intact after the etching process. Where the photoresist material is a negative photoresist material, the portions of the photoresist material exposed to UV radiation may remain intact after the etching process, while the unexposed portions of the photoresist material may be subsequently etched.

Bumps are then plated using the photoresist layer as shown at 805 in FIG. 8. FIG. 9-4 depicts the bumps 907 after plating using the first photoresist layer 905. Plating the bumps 907 may involve forming one or more metal layers and a solder layer, which are not illustrated for purposes of simplicity. In some embodiments, plating the bumps may involve first forming a copper pillar bump having a height between 10 and 25 µm followed by forming solder composed of Tin/Aluminum (Sn/Ag) and having a height between 10 and 15 µm on the copper pillar bump. Together the copper pillar bump and solder form the plated bump.

The bumps 907 are used to subsequently populate the complete interposer dies 902 with semiconductor dies. The bumps 907 are coupled to corresponding bumps on the semiconductor dies to allow for electrical connections to be made between the semiconductor dies and the complete interposer dies 902.

Although only the complete interposer dies 902 will be subsequently populated with semiconductor dies, both the complete and incomplete interposer dies 904 are plated with bumps 907 in order to ensure bump uniformity and optimal bump density across the interposer wafer 901 to promote effective current density, among other reasons.

After the bumps have been plated, the first photo resist layer is stripped as shown at 807 in FIG. 8. FIG. 9-5 depicts the resulting structure after the first photoresist layer 905 has been stripped. The resulting structure includes the interposer wafer 901, under bump metal layer 903 and plated bumps 907.

In some embodiments the first photo resist layer 905 may be stripped using a chemical compound such a 1-Methyl-2-pyrrolidon (NMP), Acetone, Dimethyl sulfoxide (DMSO) or aqueous alkaline solutions such as 2-3% Potassium Hydroxide (KOH) or Sodium Hydroxide (NaOH). Such chemical compounds allow for the first photo resist layer 905 to be stripped without stripping away the plated bumps 907 and the under bump metal layer 903. Other techniques for stripping the first photo resist layer 905 may be used.

A second photoresist layer is then formed to protect the bumps formed on the incomplete interposer die(s) and/or defective interposer die(s) as shown at 809 in FIG. 8. FIG. 9-6 depicts the resulting structure after the second photoresist layer 909 is formed. FIG. 9-6 depicts the second photoresist layer 909 being formed to protect the bumps 907 formed on all the incomplete interposer dies 904 of the interposer wafer 901. However, it is important to note that where defective complete interposer dies exist in the interposer wafer 901, the second photoresist layer 909 is also formed to protect those defective complete interposer dies.

In some embodiments, the second photo resist layer 909 may be formed by depositing photoresist material and patterning the photoresist material such that it covers the bumps formed on incomplete and defective interposer dies and exposes the bumps formed on good interposer dies. The photoresist material may be patterned by aligning a mask having the desired pattern with the photoresist material, exposing the photoresist material using the mask, and etching the photoresist material such that the exposed portions or unexposed portions are removed to form the desired pattern. The second photo resist layer 909 may be formed using the same techniques used to form the first photoresist layer 905. Other techniques for forming the second photo resist layer 909 may be used.

An etch of the under bump metal layer formed on the complete interposer dies is then performed as shown at 811 in FIG. 8. FIG. 9-7 depicts the resulting structure after the etch of the bumps 907 formed on the complete interposer dies 902 is performed. The resulting structure includes the bumps 907 and corresponding portions of the under bump metal layer 903 formed on the complete interposer dies 902, as well as the bumps 907 and under bump metal layer 903 formed on the incomplete interposer dies 904 that are protected by the second photoresist layer 909. While not illustrated, it is important to note that where defective complete interposer dies exist in the interposer wafer 901, the bumps 907 and under bump metal layer 903 formed on those defective interposer dies will remain after the etch of the under bump metal layer formed on the complete interposer dies is performed.

Etching of the under bump metal layer 903 is performed in order to remove portions of the under bump metal layer 903 that are not populated with bumps 907. Various chemical processes may be used to etch the under bump metal layer 903. For example, a sulfuric peroxide solution may be used to etch copper (Cu) while a hydrogen peroxide or hydrogen fluoride solution may be used to etch titanium (Ti). Other techniques for etching the under bump metal layer 903 may be used.

After the etching of the under bump metal layer is performed, the second photo resist layer is stripped as shown at 813 in FIG. 8. Stripping of the second photoresist layer 909 may be accomplished in the same manner as used to strip the first photoresist layer 905. FIG. 9-8 depicts the resulting structure after the second photoresist layer 909 has been stripped. The resulting structure includes the interposer wafer 901, the portion of the under bump metal layer 903 formed over good interposer dies, plated bumps 907 formed on good interposer dies 902, as well as the bumps 907 and under bump metal layer 903 formed on the incomplete interposer dies 904 that were protected by the second photoresist layer 909. If there is defective complete interposer die(s), the resulting structure will include bumps 907 and under bump metal layer 903 formed on the defective complete interposer die(s).

A third photoresist layer is then formed to protect the bumps formed on the complete interposer dies as shown at 815 in FIG. 8. FIG. 9-9 depicts the resulting structure after the third photoresist layer 911 is formed. FIG. 9-9 depicts the third photoresist layer 911 being formed to protect the bumps 907 and portions of the under bump metal layer 903 formed on all the complete interposer dies 902 of the interposer wafer 901. However, it is important to note that where defective complete interposer dies exist in the interposer wafer 901, the third photoresist layer 911 is not formed to protect those defective complete interposer dies. Thus, the third photoresist layer is formed to protect only the good bumps on the complete and non-defective dies.

In some embodiments, the third photo resist layer 911 may be formed by depositing photoresist material and patterning the photoresist material such that it covers the bumps formed on good interposer dies and exposes the bumps formed on incomplete interposer dies and defective complete interposer dies. The photoresist material may be patterned by aligning a mask having the desired pattern with the photoresist material, exposing the photoresist material using the mask, and etching the photoresist material such that the exposed portions or unexposed portions are removed to form the desired pattern. The third photo resist layer 911 may be formed using the same techniques used to form the first photoresist layer 905 or the second photoresist layer 909. Other techniques for forming the third photo resist layer 911 may be used.

Figures 1, 9:
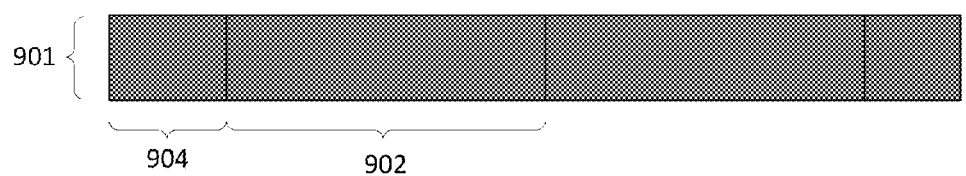
Figures 2, 9:
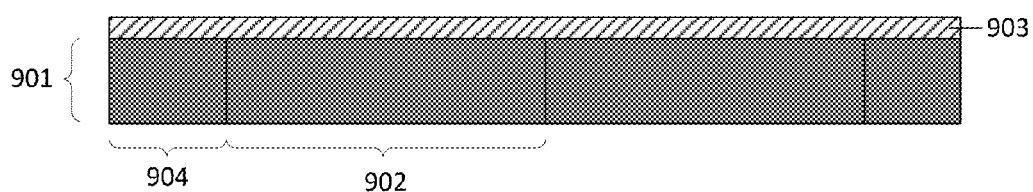
Figures 3, 9:
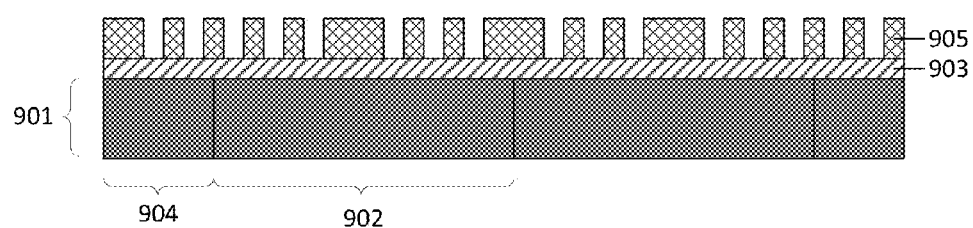
Figures 4, 9:
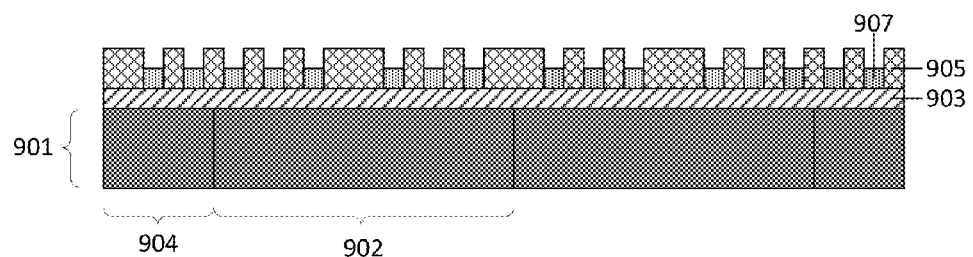
Figures 5, 9:
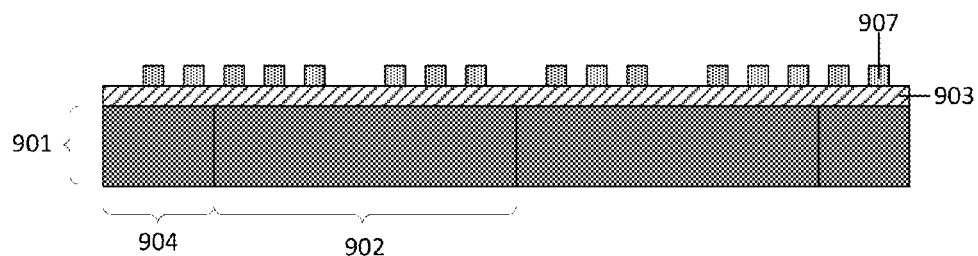
Figures 6, 9:
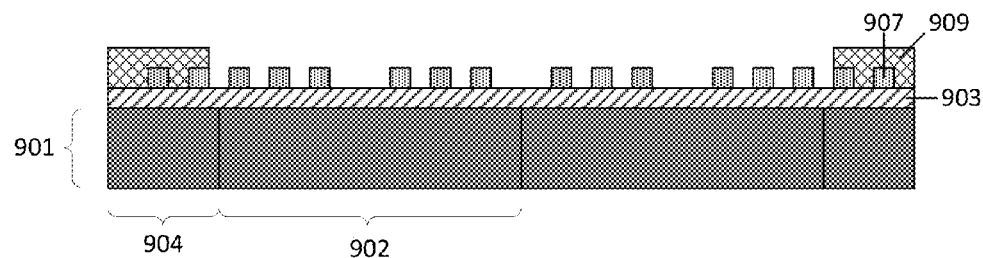
Figures 7, 9:
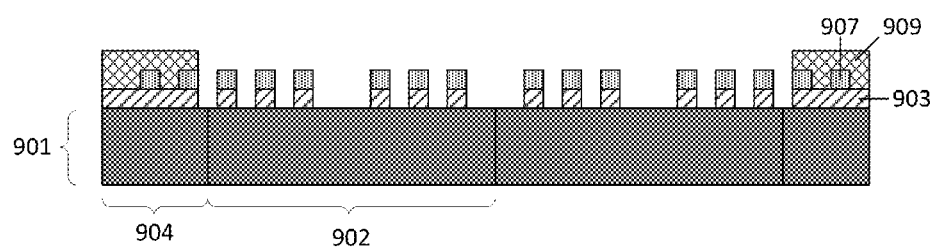
Figures 8, 9:
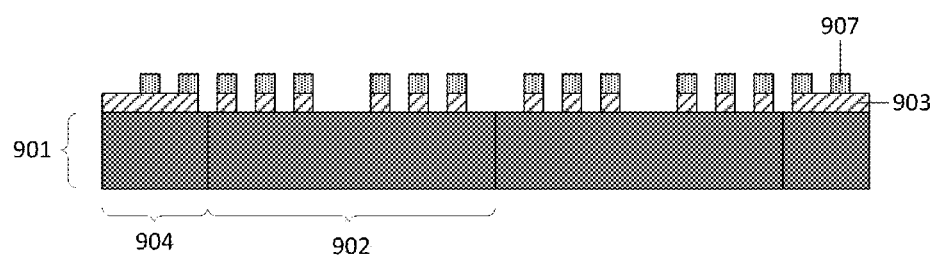
Figure 9:
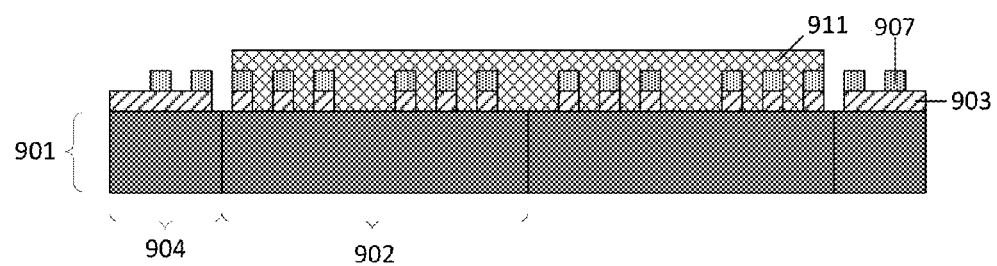
Figures 9, 10:
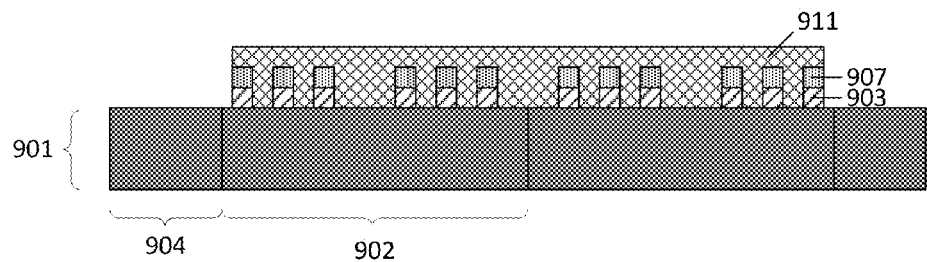

An etch of the bumps formed on the incomplete interposer dies or complete defective interposer dies is then performed as shown at 817 in FIG. 8. FIG. 9-10 depicts the resulting structure after the etch of the bumps formed on the incomplete interposer dies is performed. FIG. 9-10 depicts the removal of bumps formed on incomplete interposer dies. However, it is important to note that where defective complete interposer dies exist in the interposer wafer 901, the etch may also remove bumps formed on those defective complete interposer dies.

The etching of bumps formed on the incomplete and defective interposer dies may also include etching portions of the under bump metal layer formed on those incomplete and defective interposer dies. Various chemical processes may be used to etch the bumps and portions of the under bump metal layer formed on the incomplete interposer or defective interposer dies. For example, a sulfuric peroxide solution may be used to etch copper (Cu) while a hydrogen peroxide or hydrogen fluoride solution may be used to etch titanium (Ti). Other techniques for etching of the bumps may be used.

After the bumps formed on the incomplete and defective interposer dies have been etched, the third photo resist layer is stripped as shown at 819 in FIG. 8. The third photoresist layer 911 may be stripped using the same techniques used to strip the second photoresist layer 909 or the first photoresist layer 905. Such techniques allow for the third photo resist layer 911 to be stripped without stripping away the plated bumps 907 and the under bump metal layer 903.

Reflow joining may then be performed as shown at 821 followed by interposer wafer cleaning as shown at 823. Reflow joining is performed to effectively join the bump with the under bump metal layer. Cleaning is performed to remove any residue resulting from fabrication of the interposer wafer. In some embodiments cleaning may be performed using deionized (DI) water. In other embodiments, cleaning may be performed using various chemicals including acetone, alcohol, or other alkaline reagants.

Figures 9, 10, 11:
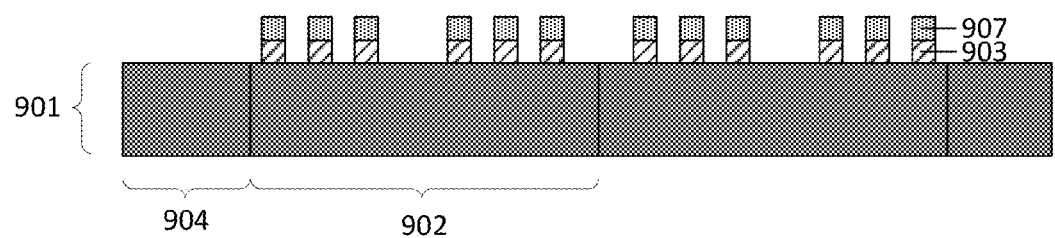
Figures 1, 10:
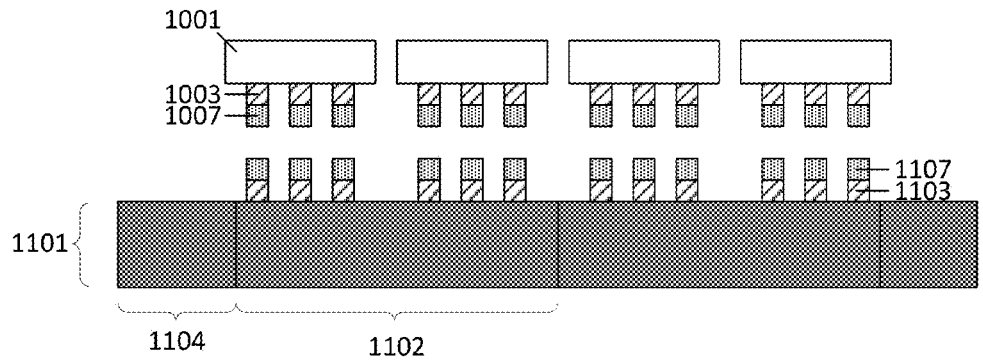
Figures 2, 10:
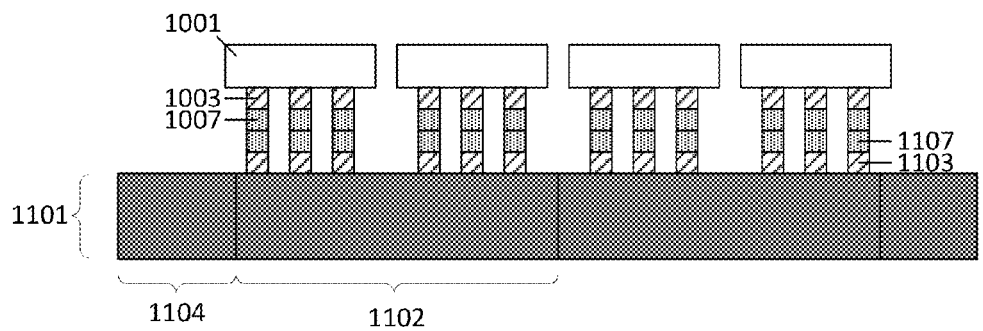

FIG. 9-11 depicts the resulting structure after stripping of the third photoresist layer, reflow joining, and cleaning are performed. The resulting structure includes bumps 907 and under metal layer 903 formed only on the good interposer dies. Similar to an incomplete die 904, if there is a defective interposer die, the defective interposer die will not include and metal layer 903 and bumps 907.

FIGS. 10-1 to 10-2 are schematic diagrams illustrating the interposer wafer formed using the methods depicted in FIGS. 6, 7-1 to 7-9, 8 and 9-1 to 9-11 being populated with semiconductor dies. As illustrated in FIG. 10-1, the semiconductor dies 1001 include complementary bumps 1007 and a complementary under bump metal layer 1003 that are used for electrically connecting the semiconductor dies 1001 to the complete interposer dies 1102.

Various process steps may be performed to couple the bumps 1007 and under bump metal layer 1003 of the semiconductor dies 1001 with the bumps 1107 and under bump metal layer 1103 of the complete interposer wafer dies 1102. Only complete interposer wafer dies 1102 are populated with semiconductor dies 1001. Incomplete interposer wafer dies 1104 are not populated with semiconductor dies 1001. Additionally, defective interposer wafer dies (not shown) are also not populated with semiconductor dies 1001. FIG. 10-2 depicts the resulting SSIT devices after the complete interposer dies 1102 are populated with semiconductor dies 1001.

As already discussed above, removing bumps formed on the incomplete interposer die(s) and/or defective interposer die(s) ensures that those bumps that would otherwise exist on such die(s) will not be subsequently dislodged to cause potential shorts and other reliability issues for SSIT devices formed using the good interposer dies.

Although particular features have been shown and described, it will be understood that they are not intended to limit the claimed invention, and it will be made obvious to those skilled in the art that various changes and modifications may be made without departing from the spirit and scope of the claimed invention. The specification and drawing are, accordingly, to be regarded in an illustrative rather than restrictive sense. The claimed invention is intended to cover all alternatives, modifications and equivalents.

What is claimed is:
1. A method for removing bumps from incomplete interposer die(s) and/or defective interposer die(s) of an interposer wafer, comprising:
   forming bumps on an interposer wafer;
   identifying at least one incomplete interposer die and/or at least one defective interposer die of the interposer wafer;
   removing bumps from the at least one incomplete interposer die and/or the at least one defective interposer die of the interposer wafer;
   wherein the act of forming bumps on the interposer wafer comprises:
      performing under bump metallization on the interposer wafer to form an under bump metal layer on the interposer wafer;
      forming a first photoresist layer on the under bump metal layer;
      plating bumps on the under bump metal layer using the first photoresist layer; and
      stripping the first photoresist layer;
   wherein the act of removing bumps from the at least one incomplete interposer die and/or the at least one defective interposer die of the interposer wafer, comprises:
      forming a second photoresist layer to protect bumps corresponding to interposer dies of the interposer wafer that are to be populated with semiconductor dies;

etching bumps corresponding to the identified at least one incomplete interposer die and/or at least one defective interposer die of the interposer wafer; and
stripping the second photoresist layer.

2. The method of claim 1, wherein the first photoresist layer is formed using a positive photoresist material.

3. The method of claim 1, further comprising:
etching the under bump metal layer;
performing reflow joining on the interposer wafer; and
cleaning the interposer wafer.

4. The method of claim 1, wherein the act of removing bumps from the at least one incomplete interposer die and/or the at least one defective interposer die of the interposer wafer, comprises:
forming a third photoresist layer to protect bumps corresponding to the interposer dies of the interposer wafer that are to be populated with semiconductor dies;
etching bumps corresponding to the identified at least one incomplete interposer die and/or at least one defective interposer die of the interposer wafer; and
stripping the third photoresist layer.

5. The method of claim 4, further comprising:
performing reflow joining on the interposer wafer; and
cleaning the interposer wafer.

6. The method of claim 1, wherein the under bump metal layer comprises multiple metal layers.

7. The method of claim 1, wherein the act of forming the first photoresist layer on the under bump metal layer comprises forming openings in the first photoresist layer where the bumps are to be plated.

8. The method of claim 1, wherein the act of plating the bumps on the under bump metal layer comprises forming one or more metal layers and a solder layer.

9. The method of claim 1, further comprising:
populating good interposer dies of the interposer wafer with semiconductor dies.

10. The method of claim 1, wherein the interposer wafer is a reconstituted wafer.

11. A method for removing bumps from incomplete interposer die(s) and/or defective interposer die(s) of an interposer wafer, comprising:
forming bumps on the interposer wafer;
identifying at least one incomplete interposer die and/or at least one defective interposer die of the interposer wafer;
forming a first photoresist layer to protect bumps corresponding to interposer dies of the interposer wafer that are to be populated with semiconductor dies;
etching bumps corresponding to the identified at least one incomplete interposer die and/or at least one defective interposer die of the interposer wafer; and
stripping the first photoresist layer.

12. The method of claim 11, wherein the act of forming bumps on the interposer wafer comprises:
performing under bump metallization on the interposer wafer to form an under bump metal layer on the interposer wafer;
forming a second photoresist layer on the under bump metal layer;
plating bumps on the under bump metal layer using the second photoresist layer; and
stripping the second photoresist layer.

13. The method of claim 12, further comprising:
etching the under bump metal layer;
performing reflow joining on the interposer wafer; and
cleaning the interposer wafer.

14. The method of claim 12, wherein the under bump metal layer comprises multiple metal layers.

15. The method of claim 12, wherein the act of forming the second photoresist layer on the under bump metal layer comprises forming openings in the second photoresist layer where the bumps on the under bump metal layer are to be plated.

16. The method of claim 12, wherein the act of plating the bumps on the under bump metal layer comprises forming one or more metal layers and a solder layer.

17. The method of claim 11, further comprising:
populating good interposer dies of the interposer wafer with semiconductor dies.

18. The method of claim 11, wherein the interposer wafer is a reconstituted wafer.

19. The method of claim 11, wherein the interposer wafer comprises an active die.

* * * * *